US011581258B2

(12) United States Patent
Huang

(10) Patent No.: US 11,581,258 B2
(45) Date of Patent: Feb. 14, 2023

(54) SEMICONDUCTOR DEVICE STRUCTURE WITH MANGANESE-CONTAINING INTERCONNECT STRUCTURE AND METHOD FOR FORMING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 185 days.

(21) Appl. No.: 17/148,041

(22) Filed: Jan. 13, 2021

(65) Prior Publication Data

US 2022/0223535 A1 Jul. 14, 2022

(51) Int. Cl.
*H01L 23/532* (2006.01)
*H01L 23/528* (2006.01)
*H01L 21/768* (2006.01)

(52) U.S. Cl.
CPC .. *H01L 23/53238* (2013.01); *H01L 21/76816* (2013.01); *H01L 21/76843* (2013.01); *H01L 21/76877* (2013.01); *H01L 23/5283* (2013.01)

(58) Field of Classification Search
CPC ......... H01L 21/76831; H01L 21/76843; H01L 21/76846; H01L 21/76873; H01L 21/76864; H01L 21/76834; H01L 21/76849; H01L 21/76867; H01L 21/76816; H01L 21/76877; H01L 23/5226; H01L 23/53238; H01L 23/5283
See application file for complete search history.

(56) References Cited

U.S. PATENT DOCUMENTS

| 2014/0273436 A1* | 9/2014 | Hintze | H01L 21/76856 438/653 |
| 2016/0056112 A1* | 2/2016 | Edelstein | H01L 23/53238 257/751 |
| 2019/0103310 A1 | 4/2019 | Liang et al. | |
| 2019/0326220 A1 | 10/2019 | Tung et al. | |
| 2020/0328152 A1 | 10/2020 | Huang et al. | |

FOREIGN PATENT DOCUMENTS

| CN | 101436579 A | 5/2009 |
| TW | 201533845 A | 9/2015 |

* cited by examiner

*Primary Examiner* — Jaehwan Oh
*Assistant Examiner* — John M Parker
(74) *Attorney, Agent, or Firm* — Muncy, Geissler, Olds & Lowe, P.C.

(57) ABSTRACT

The present disclosure provides a semiconductor device structure with a manganese-containing interconnect structure and a method for forming the semiconductor device structure. The semiconductor device structure includes a first interconnect structure disposed in a semiconductor substrate, a dielectric layer disposed over the semiconductor substrate, and a second interconnect structure disposed in the dielectric layer and electrically connected to the first interconnect structure. The first interconnect structure includes a first conductive line, and a first manganese-containing layer disposed over the first conductive line. The second interconnect structure includes a second conductive line, and a second manganese-containing layer disposed between the second conductive line and the dielectric layer.

16 Claims, 19 Drawing Sheets

SEMICONDUCTOR DEVICE STRUCTURE WITH MANGANESE-CONTAINING INTERCONNECT STRUCTURE AND METHOD FOR FORMING THE SAME

TECHNICAL FIELD

The present disclosure relates to a semiconductor device structure and a method for forming the same, and more particularly, to a semiconductor device structure with a manganese-containing interconnect structure and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as void formed in conductive line, which results from the difficulties in filling a high aspect ratio opening. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first interconnect structure disposed in a semiconductor substrate, a dielectric layer disposed over the semiconductor substrate, and a second interconnect structure disposed in the dielectric layer and electrically connected to the first interconnect structure. The first interconnect structure includes a first conductive line, and a first manganese-containing layer disposed over the first conductive line. The second interconnect structure includes a second conductive line, and a second manganese-containing layer disposed between the second conductive line and the dielectric layer.

In an embodiment, the first manganese-containing layer and the second manganese-containing layer are made of manganese, and the first conductive line and the second conductive line are made of copper. In an embodiment, a top surface of the first manganese-containing layer is substantially level with a top surface of the semiconductor substrate. In an embodiment, the first interconnect structure further includes a first barrier layer surrounding the first conductive line and the first manganese-containing layer, wherein the first conductive line is disposed over the first barrier layer. In an embodiment, the second interconnect structure further includes a second barrier layer disposed between the second manganese-containing layer and the dielectric layer, wherein the second barrier layer is in direct contact with the first manganese-containing layer of the first interconnect structure.

In an embodiment, the semiconductor device structure further includes a third interconnect structure disposed in the semiconductor substrate. The third interconnect structure includes a third conductive line, and a third manganese-containing layer disposed over the third conductive line. The third manganese-containing layer of the third interconnect structure and the first manganese-containing layer of the first interconnect structure are made of a same material. In an embodiment, the first interconnect structure and the second interconnect structure are disposed in a pattern-loose region, and the third interconnect structure is disposed in a pattern-dense region. In an embodiment, the third interconnect structure is entirely covered by the dielectric layer.

In another embodiment of the present disclosure, a semiconductor device structure is provided. The semiconductor device structure includes a first interconnect structure disposed in a semiconductor substrate, and a second interconnect structure disposed over the semiconductor substrate and electrically connected to the first interconnect structure. The first interconnect structure includes a first barrier layer, a first conductive line disposed over the first barrier layer, and a first manganese-containing layer disposed over the first conductive line. The first manganese-containing layer and the first conductive line are separated from the semiconductor substrate by the first barrier layer. The second interconnect structure includes a second barrier layer disposed over and in direct contact with the first manganese-containing layer, a second manganese-containing layer disposed over the second barrier layer, and a second conductive line disposed over the second manganese-containing layer.

In an embodiment, the second conductive line is surrounded by the second manganese-containing layer, and the second manganese-containing layer is surrounded by the second barrier layer. In an embodiment, a width of an upper portion of the second conductive line is greater than a width of a lower portion of the second conductive line. In an embodiment, the semiconductor device structure further includes a dielectric layer disposed over the semiconductor substrate and covering a portion of the first barrier layer and a portion of the first manganese-containing layer, wherein the second interconnect structure penetrates through the dielectric layer.

In an embodiment, the first conductive line and the second conductive line comprise copper. In an embodiment, the first interconnect structure has a first manganese atomic percentage, the second interconnect structure has a second manganese atomic percentage, and the first manganese atomic percentage is different from the second manganese atomic percentage. In an embodiment, the first manganese atomic percentage is greater than the second manganese atomic percentage.

In yet another embodiment of the present disclosure, a semiconductor device structure is provided. The semiconductor device structure includes a first interconnect structure disposed in a semiconductor substrate, and a second interconnect structure disposed over and electrically connected to the first interconnect structure. The first interconnect structure includes a first conductive line, and a first manganese-containing layer disposed over the first conductive line. A top surface of the first manganese-containing layer is substantially level with a top surface of the semiconductor substrate. The second interconnect structure includes a second manganese-containing layer, and a second conductive line disposed over the second manganese-containing layer. The second manganese-containing layer covers sidewalls of the second conductive line. The first interconnect structure has a first manganese atomic percentage, the second interconnect structure has a second manganese atomic percentage, and the first manganese atomic percentage is different from the second manganese atomic percentage.

In an embodiment, the first manganese atomic percentage is greater than the second manganese atomic percentage. In an embodiment, the semiconductor device structure further includes a third interconnect structure disposed in the semiconductor substrate. The third interconnect structure includes a third conductive line, and a third manganese-containing layer disposed over the third conductive line. The third interconnect structure is disposed in a pattern-dense region, and the first interconnect structure and the second interconnect structure are disposed in a pattern-loose region.

In an embodiment, the third interconnect structure has a third manganese atomic percentage, and the third manganese atomic percentage is greater than the second manganese atomic percentage. In an embodiment, the first interconnect structure further includes a first barrier layer separating the first conductive line and the first manganese-containing layer from the semiconductor substrate, and the second interconnect structure further includes a second barrier layer sandwiched between the second manganese-containing layer and the first manganese-containing layer.

Embodiments of a semiconductor device structure and method for forming the same are provided in the disclosure. In some embodiments, the semiconductor device structure includes a first interconnect structure disposed in a semiconductor substrate, and a second interconnect structure disposed in a dielectric layer over the semiconductor substrate. The first interconnect structure is electrically connected to the second interconnect structure. The first interconnect structure includes a first manganese-containing layer disposed over a first conductive line, and the second interconnect structure includes a second manganese-containing layer disposed between a second conductive line and the dielectric layer. The first and second manganese-containing layers are configured to reduce or prevent voids from forming in the first and second conductive lines, thereby decreasing the contact resistance.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
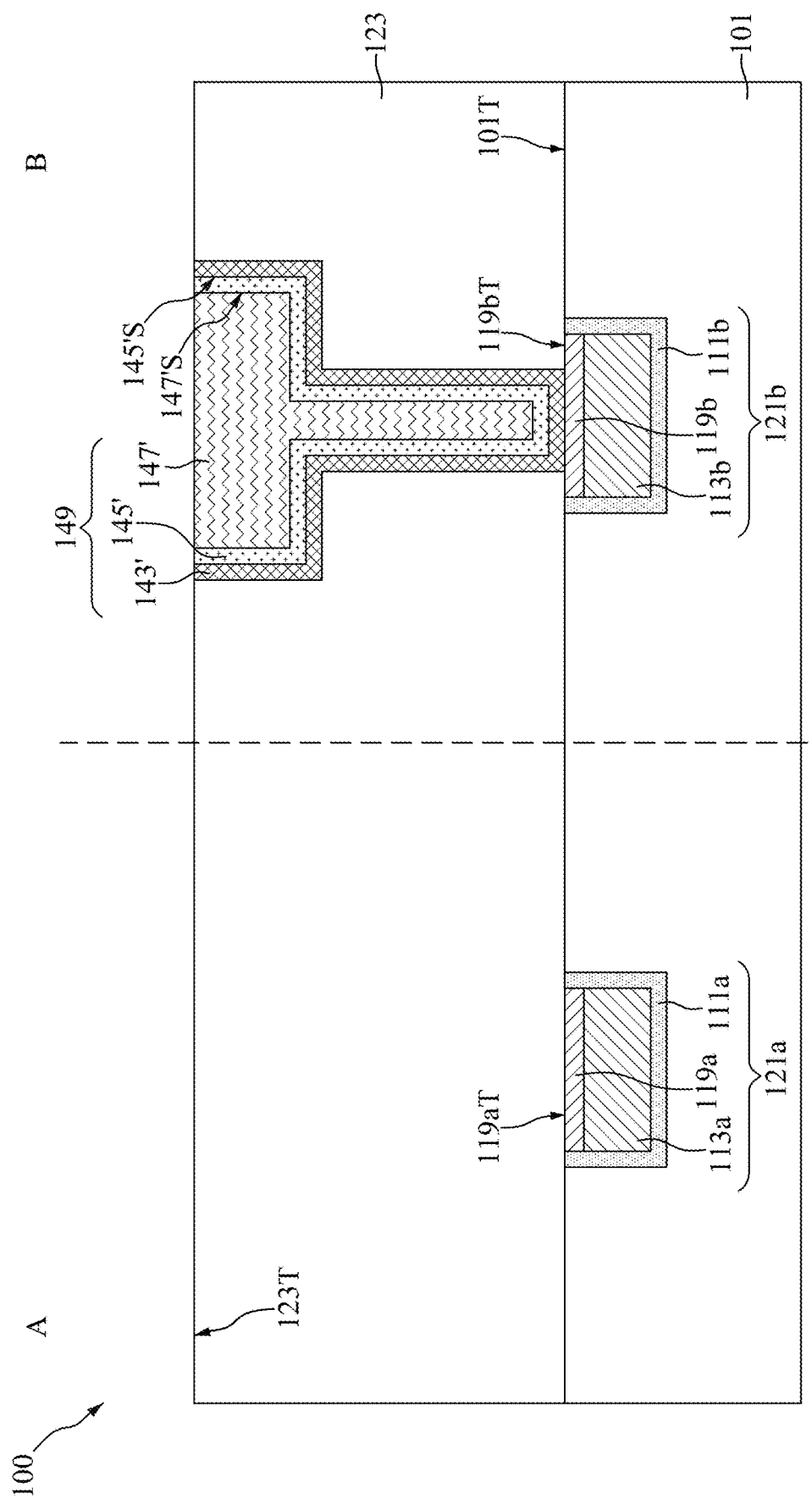
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100, in accordance with some embodiments. As shown in FIG. 1, the semiconductor device structure 100 includes a pattern-dense region A and a pattern-loose region B. In some embodiments, the dashed lines indicating the boundary of the pattern-dense region A and the pattern-loose region B is used to clarify the disclosure. No obvious interfaces exist between the pattern-dense region A and the pattern-loose region B.

In some embodiments, the semiconductor device structure 100 includes a semiconductor substrate 101, and interconnect structures 121a and 121b (also referred to as lower interconnect structures) disposed in the semiconductor substrate 101. In some embodiments, the interconnect structure 121a is located in the pattern-dense region A, and the interconnect structure 121b is located in the pattern-loose region B. In some embodiments, the details of the interconnect structure 121a are similar to, or the same as the details of the interconnect structure 121b, except that they are located in the different regions.

Specifically, the interconnect structure 121a includes a barrier layer 111a, a conductive line 113a disposed over the barrier layer 111a, and a manganese-containing layer 119a disposed over the conductive line 113a. In some embodiments, the barrier layer 111a covers the sidewalls of the conductive line 113a and the sidewalls of the manganese-containing layer 119a. In some embodiments, the conductive line 113a and the manganese-containing layer 119a are separated from the semiconductor substrate 101 by the barrier layer 111a.

Similar to the interconnect structure 121a of the pattern-dense region A, the interconnect structure 121b of the pattern-loose region B includes a barrier layer 111b, a conductive line 113b disposed over the barrier layer 111b, and a manganese-containing layer 119b disposed over the conductive line 113b. In some embodiments, the conductive line 111b in the pattern-loose region B is parallel to the conductive line 111a in the pattern-dense region A. Moreover, in some embodiments, the barrier layer 111b covers the sidewalls of the conductive line 113b and the sidewalls of the manganese-containing layer 119b.

In some embodiments, the conductive line 113b and the manganese-containing layer 119b are separated from the semiconductor substrate 101 by the barrier layer 111b. In addition, the top surface 119aT of the manganese-containing layer 119a and the top surface 119bT of the manganese-containing layer 119b are substantially level with the top surface IT of the semiconductor substrate 101, in accordance with some embodiments. Within the context of this disclosure, the word "substantially" means preferably at least 90%, more preferably 95%, even more preferably 98%, and most preferably 99%.

Still referring to FIG. 1, the semiconductor device structure 100 also includes a dielectric layer 123 disposed over the semiconductor substrate 101, and an interconnect structure 149 (also referred to as an upper interconnect structure) disposed in the dielectric layer 123. It should be noted that the interconnect structure 149 is located in the pattern-loose region B and electrically connected to the interconnect structure 121b. In some embodiments, the interconnect structure 149 is in direct contact with the interconnect structure 121b.

Specifically, the interconnect structure 149 includes a barrier layer 143', a manganese-containing layer 145' disposed over the barrier layer 143', and a conductive line 147' disposed over the manganese-containing layer 145'. In some embodiments, the conductive line 147' is surrounded by the manganese-containing layer 145', and the manganese-containing layer 145' is surrounded by the barrier layer 143'. Specifically, the sidewalls 147'S of the conductive line 147' is covered by the manganese-containing layer 145', and the sidewalls 145'S of the manganese-containing layer 145' is covered by the barrier layer 143'.

In some embodiments, the manganese-containing layer 145' is sandwiched between the barrier layer 143' and the conductive line 147', and the conductive line 147' is separated from the barrier layer 143' by the manganese-containing layer 145'. In some embodiments, a portion of the barrier layer 143' is sandwiched between the manganese-containing layer 145' of the interconnect structure 149 and the manganese-containing layer 119b of the interconnect structure 121b. In some embodiments, the manganese-containing layer 145' is separated from the dielectric layer 123 by the barrier layer 143'.

Moreover, a top surface of the conductive line 147' is substantially level with a top surface of the manganese-containing layer 145' and a top surface of the barrier layer 143', in accordance with some embodiments. In some embodiments, a portion of the manganese-containing layer 119b and a portion of the barrier layer 111b of the interconnect structure 121b are covered by the dielectric layer 123. It should be noted that the interconnect structure 121a of the pattern-dense region A is entirely covered by the dielectric layer 123, in accordance with some embodiments.

In some embodiments, the manganese-containing layers 119a, 119b and 145' are made of manganese (Mn), and the conductive lines 113a, 113b and 147' are made of copper (Cu). In some embodiments, the barrier layers 111a, 111b and 143' are made of tantalum (Ta), tantalum nitride (TaN), titanium (Ti), titanium nitride (TiN), a combination thereof, or another applicable material. In some embodiments, the manganese atomic percentage of the interconnect structure 121b is substantially the same as the manganese atomic percentage of the interconnect structure 121a, and the manganese atomic percentage of the interconnect structure 121b is different from the manganese atomic percentage of the interconnect structure 149. In some embodiments, the manganese atomic percentage of the interconnect structure 121b is greater than the manganese atomic percentage of the interconnect structure 149.

Figure 2:
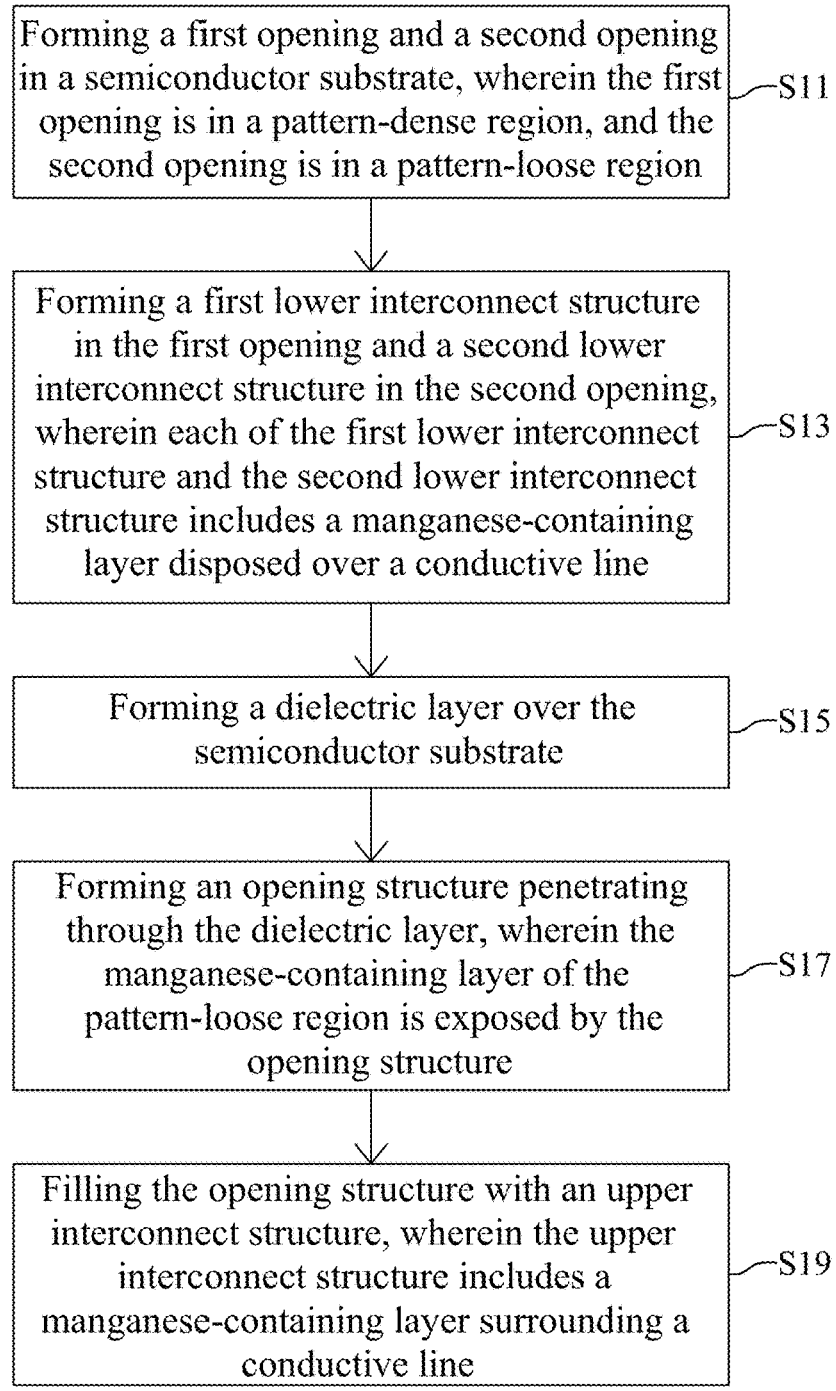
FIG. 2 is a flow diagram illustrating a method for forming a semiconductor device structure, in accordance with some embodiments.

FIG. 2 is a flow diagram illustrating a method 10 for forming a semiconductor device structure (e.g., the semiconductor device structure 100), and the method 10 includes steps S11, S13, S15, S17 and S19, in accordance with some embodiments. The steps S11 to S19 of FIG. 2 are elaborated in connection with the following figures.

Figure 3:
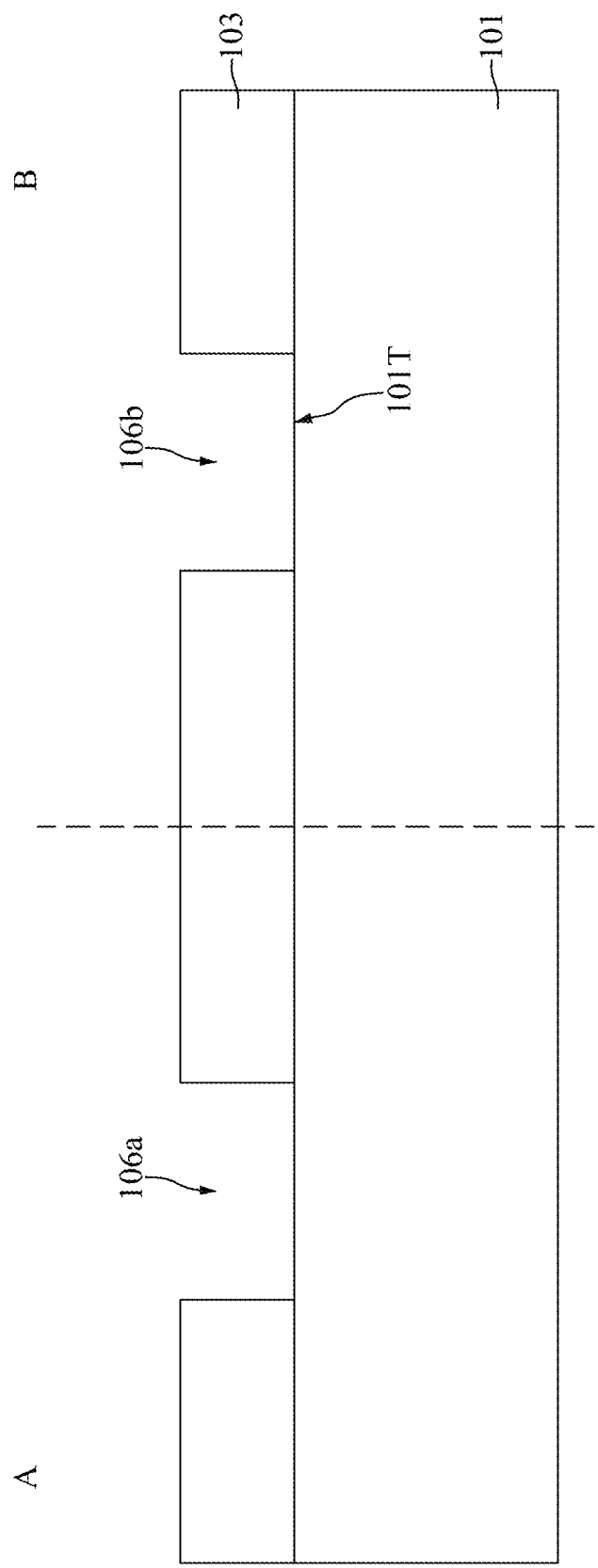
FIG. 3 is a cross-sectional view illustrating an intermediate stage of forming a patterned mask over a semiconductor substrate during the formation of the semiconductor device structure, in accordance with some embodiments.

FIGS. 3 to 18 are cross-sectional views illustrating intermediate stages of forming the semiconductor device structure 100, in accordance with some embodiments. As shown in FIG. 3, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon geranium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 3, a patterned mask 103 is formed over the semiconductor substrate 101, in accordance with some embodiments. In some embodiments, the top surface 101T of the semiconductor substrate 101 is partially exposed by openings 106a and 106b in the patterned mask 103, and the openings 106a and 106b are in the pattern-dense region A and the pattern-loose region B, respectively.

Figure 4:
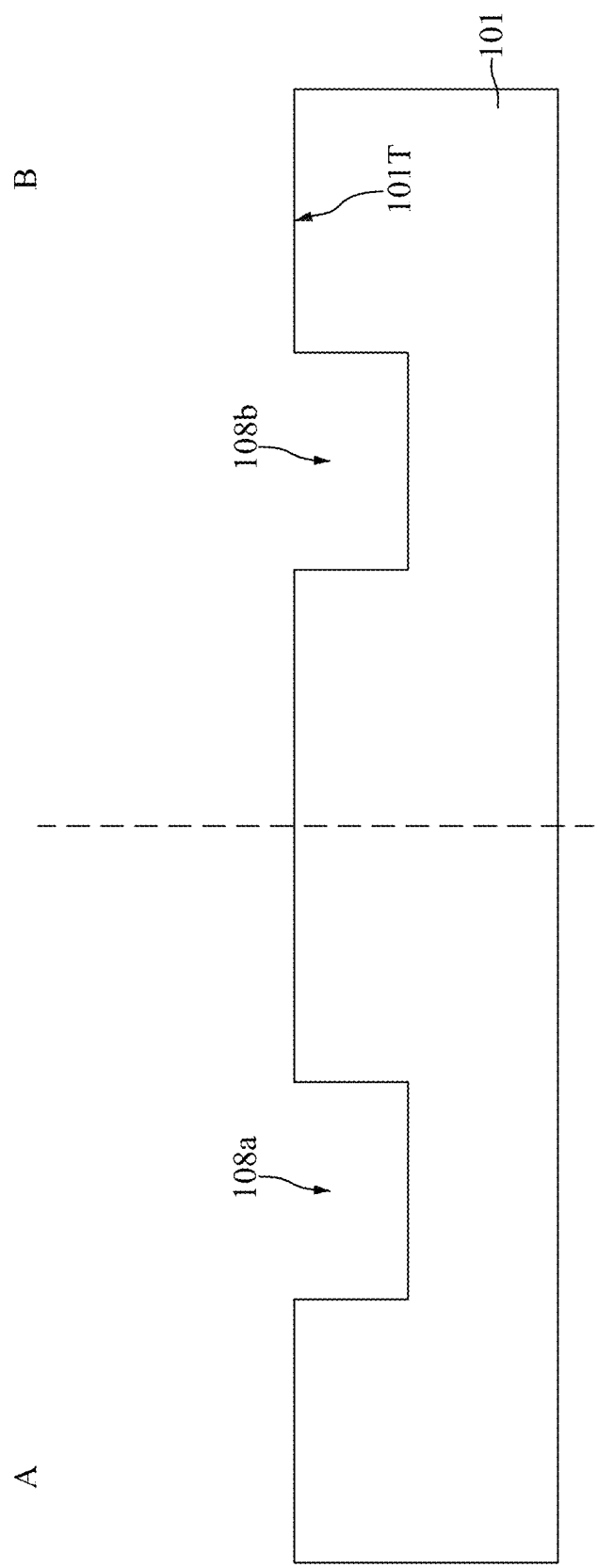
FIG. 4 is a cross-sectional view illustrating an intermediate stage of etching the semiconductor substrate to form openings using the patterned mask as a mask during the formation of the semiconductor device structure, in accordance with some embodiments.

Next, the semiconductor substrate 101 is etched to form openings 108a and 108b using the patterned mask 103 as a mask, as shown in FIG. 4 in accordance with some embodiments. The respective step is illustrated as the step S11 in the method 10 shown in FIG. 2. In some embodiments, the semiconductor substrate 101 is not etched through, and the openings 108a and 108b are in the pattern-dense region A and the pattern-loose region B, respectively. The semiconductor substrate 101 may be etched by a wet etching process, a dry etching process, or a combination thereof. After the openings 108a and 108b are formed, the patterned mask 103 may be removed.

Figure 5:
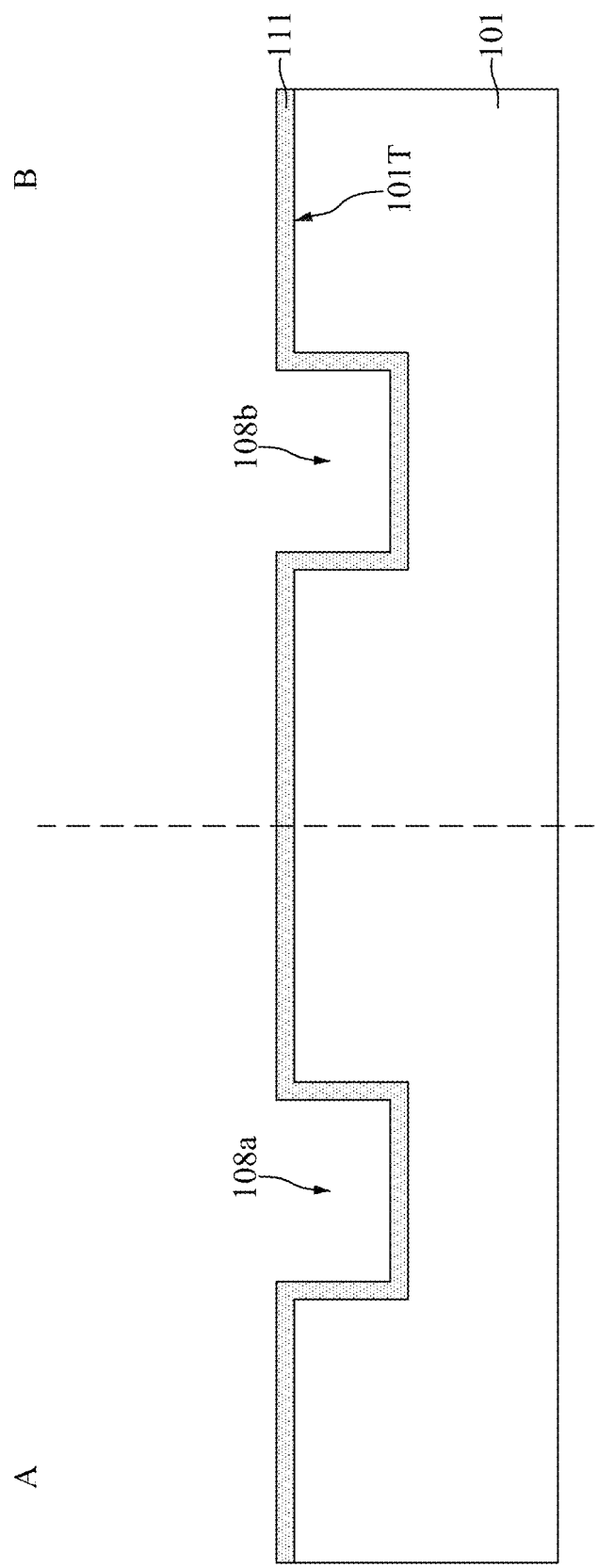
FIG. 5 is a cross-sectional view illustrating an intermediate stage of forming a barrier material in the openings and over the semiconductor substrate during the formation of the semiconductor device structure, in accordance with some embodiments.

Subsequently, a barrier material 111 is conformally deposited in the openings 108a and 108b, and over the top surface 101T of the semiconductor substrate 101, as shown in FIG. 5 in accordance with some embodiments. In some embodiments, the sidewalls and the bottom surfaces of the openings 108a and 108b are covered by the barrier material 111. In some embodiments, the barrier material 11l is made of tantalum (Ta), tantalum nitride (TaN), titanium (Ti), titanium nitride (TiN), a combination thereof, or another applicable material. The barrier material 111 may be formed using a conformal depositing method, such as a chemical vapor deposition (CVD) process, a physical vapor deposition (PVD) process, or an atomic layer deposition (ALD) process.

Figure 6:
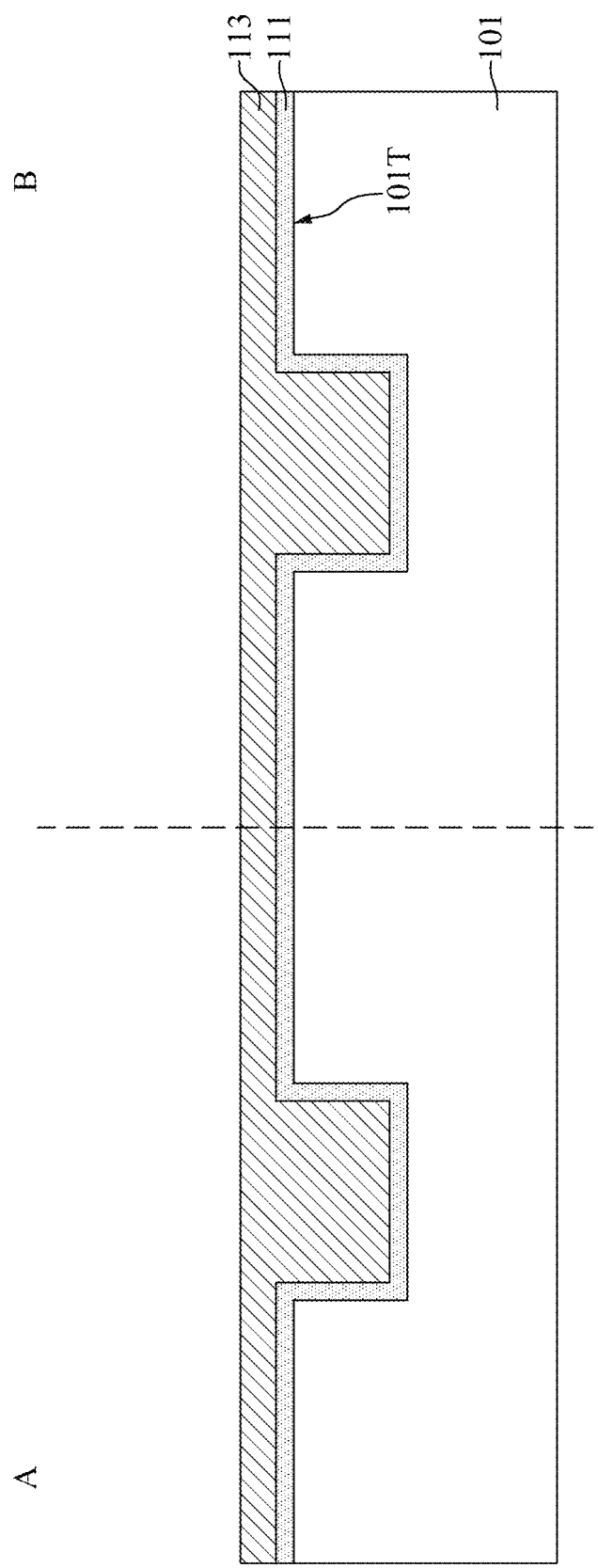
FIG. 6 is a cross-sectional view illustrating an intermediate stage of forming a conductive material in the openings and over the barrier layer during the formation of the semiconductor device structure, in accordance with some embodiments.

After the barrier material 111 is formed, a conductive material 113 is formed in the remaining portion of the openings 108a and 108b, and over the top surface 101T of the semiconductor substrate 101, as shown in FIG. 6 in accordance with some embodiments. In some embodiments, the remained portions of the openings 108a and 108b are completely filled by the conductive material 113.

In some embodiments, the conductive material 113 is made of a low resistivity conductive material, such as copper (Cu). In other embodiments, the conductive material 113 includes tungsten (W), aluminum (Al), titanium (Ti), tantalum (Ta), gold (Au), silver (Ag), a combination thereof, or another applicable conductive material. The conductive material 113 may be formed by a CVD process, a PVD process, a sputtering process, a plating process, or another applicable process.

Figure 7:
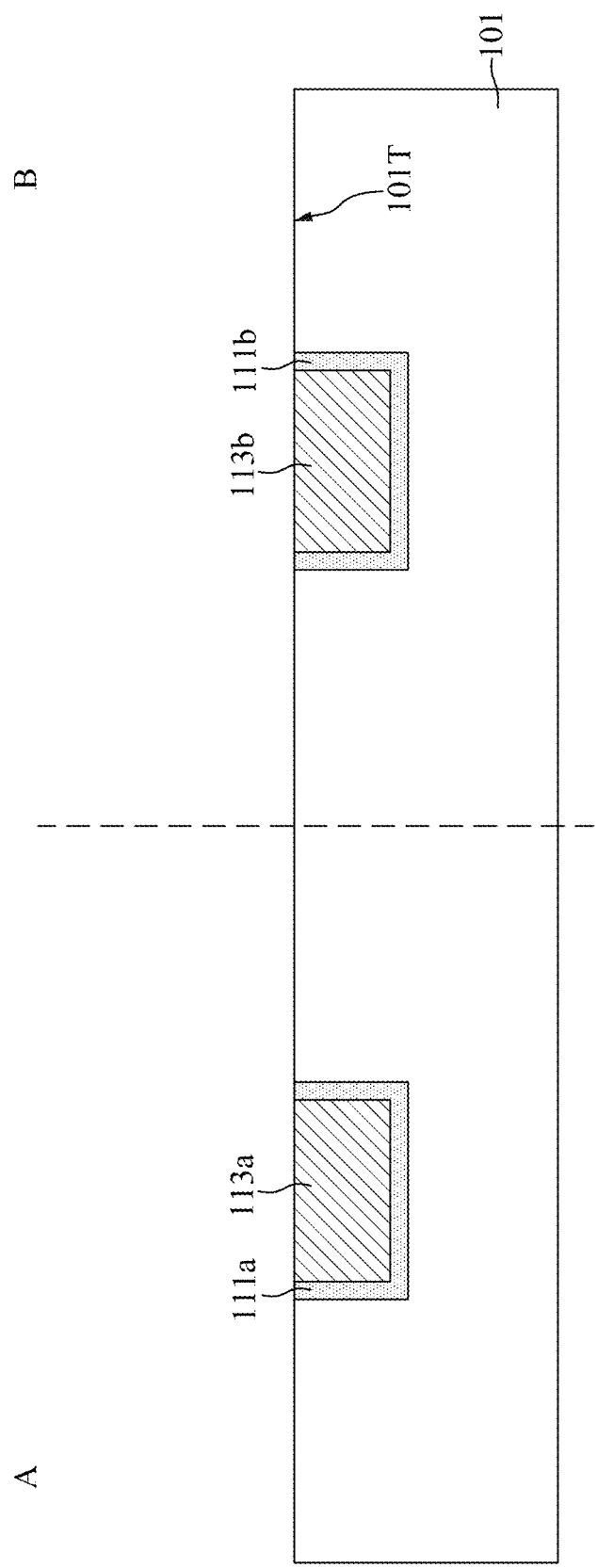
FIG. 7 is a cross-sectional view illustrating an intermediate stage of planarizing the barrier material and the conductive material to form barrier layers and conductive lines during the formation of the semiconductor device structure, in accordance with some embodiments.

Then, a planarization process is performed to remove excess portions of the barrier material 111 and the conductive material 113 over the top surface 101T of the semiconductor substrate 101, as shown in FIG. 7 in accordance with some embodiments. The planarization process may include a chemical mechanical polishing (CMP) process. After the planarization process, the top surface 101T of the semiconductor substrate 101 is exposed, the barrier layer 111a and the conductive line 113a are formed in the pattern-dense region A, and the barrier layer 111b and the conductive line 113b are formed in the pattern-loose region B, in accordance with some embodiments.

Figure 8:
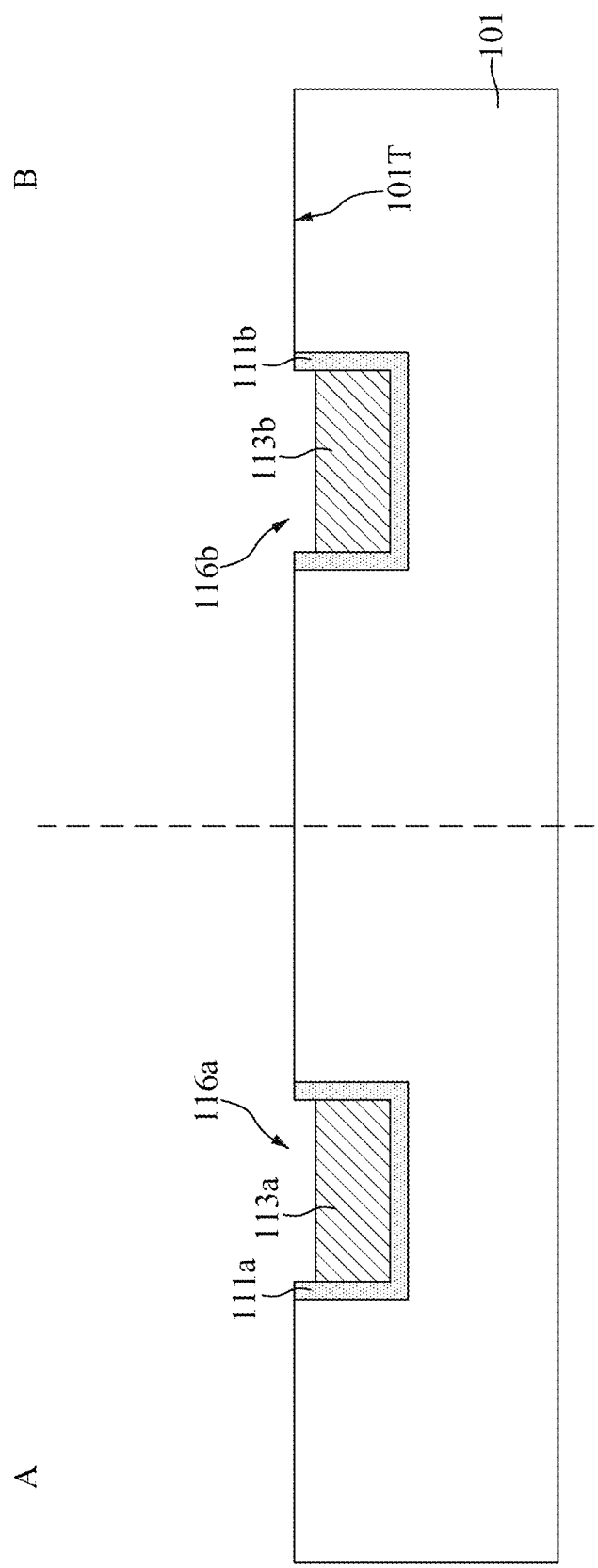
FIG. 8 is a cross-sectional view illustrating an intermediate stage of etching back the conductive lines to form recesses during the formation of the semiconductor device structure, in accordance with some embodiments.

Next, the conductive lines 113a and 113b are etched-back, resulting in recesses 116a and 116b to be formed in the pattern-dense region A and the pattern-loose region B, respectively, as shown in FIG. 8 in accordance with some embodiments. Specifically, the recess 116a is formed over the remaining portion of the conductive line 113a, and the recess 116b is formed over the remaining portion of the conductive line 113b, in accordance with some embodiments. In other words, the bottom surfaces of the recesses 116a and 116b are lower than the top surface 101T of the semiconductor substrate 101. In some embodiments, the recess 116a is surrounded by the barrier layer 111a, and the recess 116b is surrounded by the barrier layer 111b.

Figure 9:
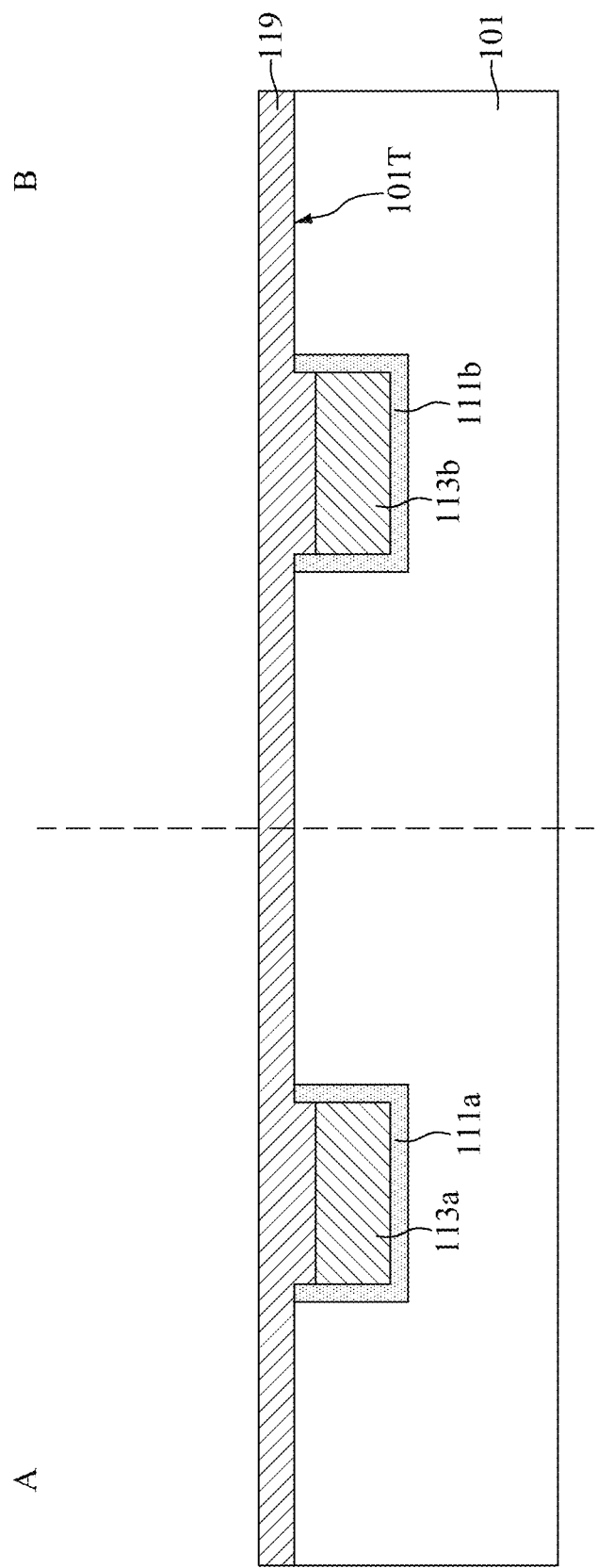
FIG. 9 is a cross-sectional view illustrating an intermediate stage of forming a manganese-containing material in the recesses and over the semiconductor substrate during the formation of the semiconductor device structure, in accordance with some embodiments.

Subsequently, a manganese-containing material 119 is formed in the recesses 116a and 116b and over the top surface 101T of the semiconductor substrate 101, as shown in FIG. 9 in accordance with some embodiments. In some embodiments, the barrier layers 111a, 111b and the conductive lines 113a, 113b are covered by the manganese-containing material 119, and the recesses 116a and 116b are completely filled by the manganese-containing material 119.

In some embodiments, the manganese-containing material 119 is made of manganese (Mn). In other embodiments, the manganese-containing material 119 is made of a manganese-rich material, such as manganese-rich copper manganese (CuMn) or manganese-rich manganese silicon (MnSi). Moreover, the manganese-containing material 119 may be formed using a conformal depositing method, such as CVD, PVD, ALD, metal organic chemical vapor deposition (MOCVD), sputtering, or plating.

Figure 10:
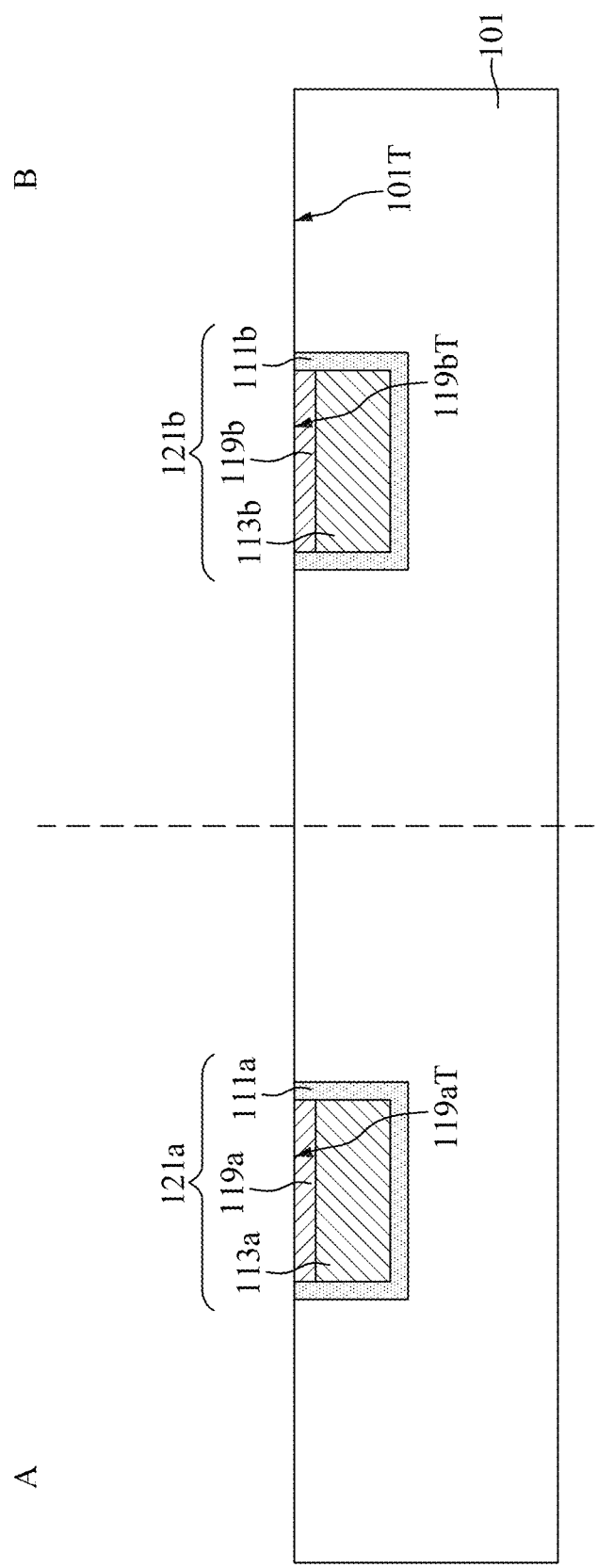
FIG. 10 is a cross-sectional view illustrating an intermediate stage of planarizing the manganese-containing material during the formation of the semiconductor device structure, in accordance with some embodiments.

Next, a planarization process is performed to remove the excess portion of the manganese-containing material 119 over the top surface 101T of the semiconductor substrate 101, as shown in FIG. 10 in accordance with some embodiments. The planarization process may include a CMP process. After the planarization process, the manganese-containing layers 119a and 119b are formed in the pattern-dense region A and the pattern-loose region B, respectively, and the interconnect structure 121a in the pattern-dense region A and the interconnect structure 121b in the pattern-loose region B are obtained. The respective step is illustrated as the step S13 in the method 10 shown in FIG. 2. In some embodiments, the top surface 119aT of the manganese-containing layer 119a and the top surface 119bT of the manganese-containing layer 119b are substantially level with the top surface 101T of the semiconductor substrate 101.

Figure 11:
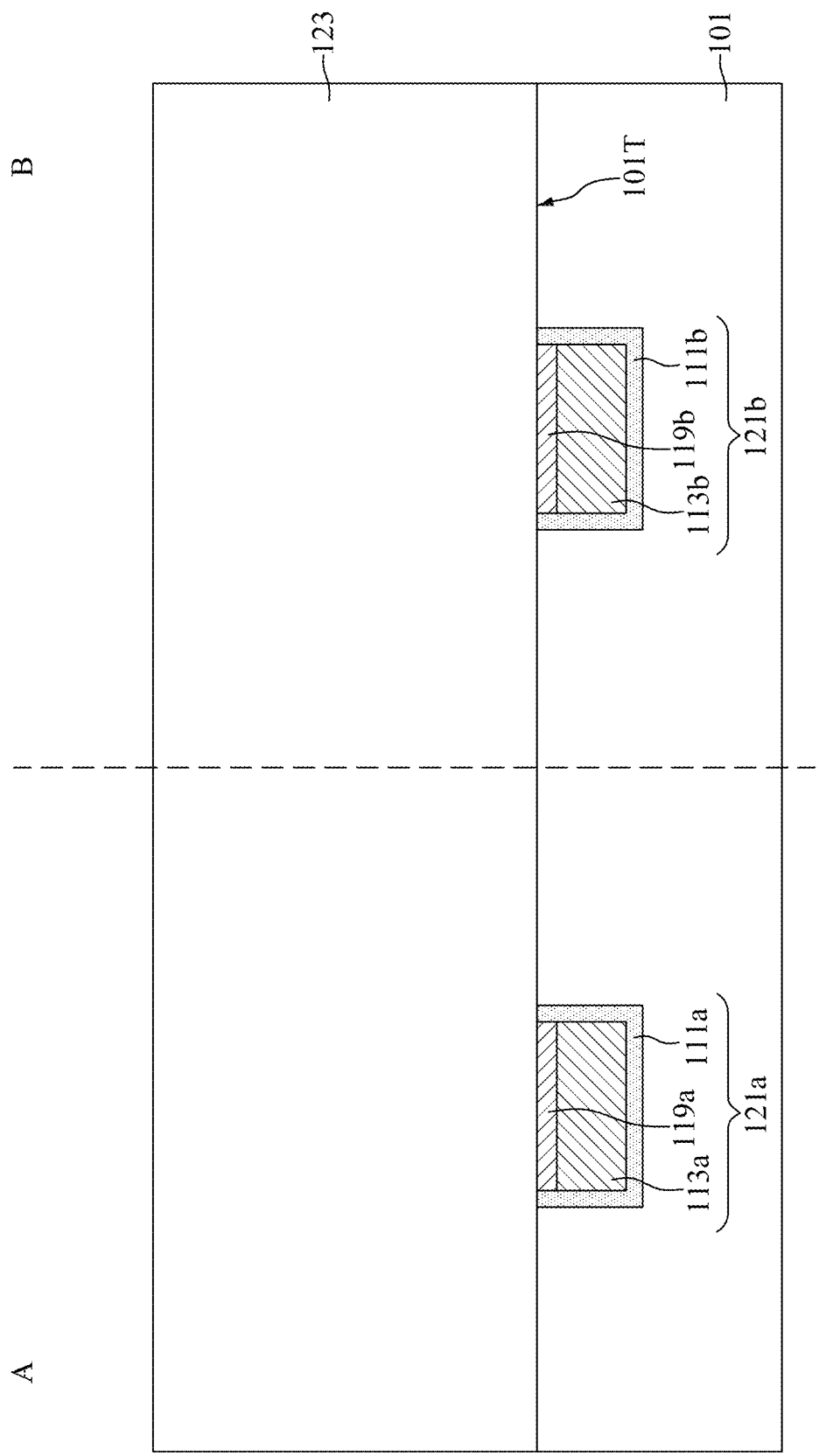
FIG. 11 is a cross-sectional view illustrating an intermediate stage of forming a dielectric layer over the semiconductor substrate during the formation of the semiconductor device structure, in accordance with some embodiments.

After the interconnect structures 121a and 121b are formed, the dielectric layer 123 is formed over the semiconductor substrate 101, as shown in FIG. 11 in accordance with some embodiments. The respective step is illustrated as the step S15 in the method 10 shown in FIG. 2. The dielectric layer 123 may be formed of or comprise, for example, silicon oxide, silicon nitride or silicon oxynitride. In addition, the dielectric layer 123 may be formed by a deposition process, such as a CVD process, a flowable chemical vapor deposition (FCVD) process, a PVD process, a spin-on coating process, or another applicable process.

Figure 12:
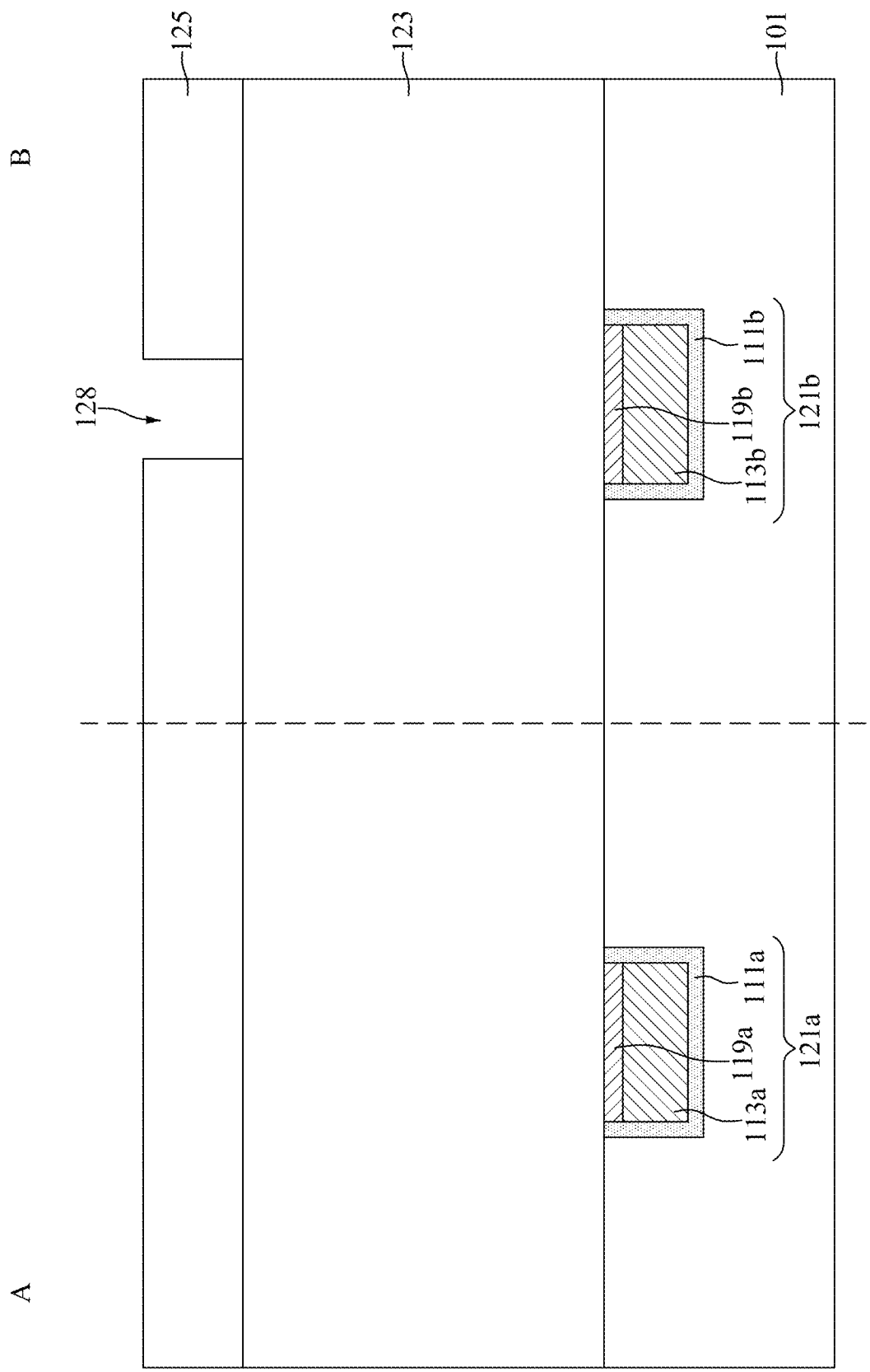
FIG. 12 is a cross-sectional view illustrating an intermediate stage of forming a patterned mask over the dielectric layer during the formation of the semiconductor device structure, in accordance with some embodiments.

Subsequently, a patterned mask 125 is formed over the dielectric layer 123, as shown in FIG. 12 in accordance with some embodiments. In some embodiments, the patterned mask 125 has an opening 128 in the pattern-loose region B, and the dielectric layer 123 is partially exposed by the opening 128.

Figure 13:
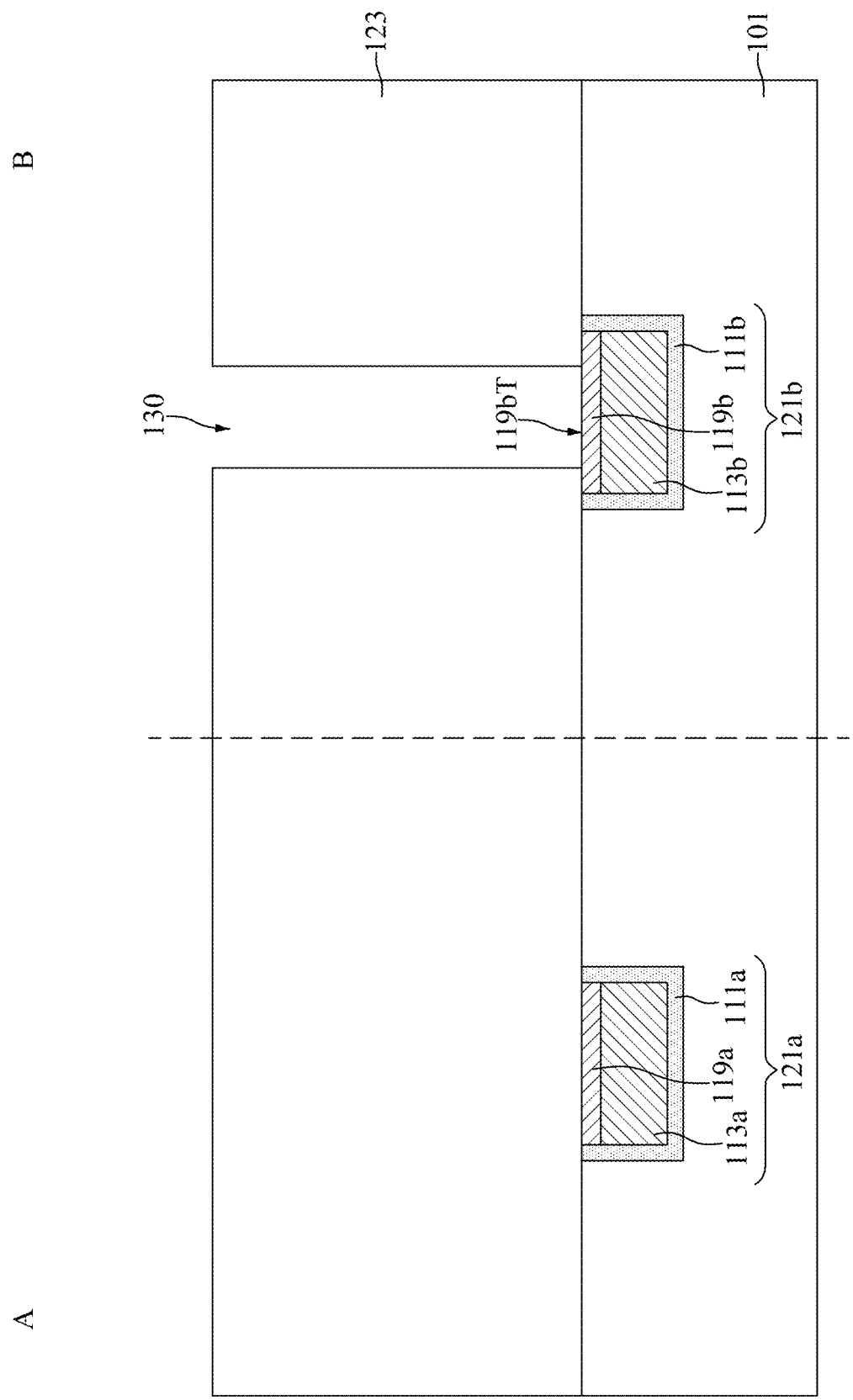
FIG. 13 is a cross-sectional view illustrating an intermediate stage of etching the dielectric layer using the patterned mask as a mask during the formation of the semiconductor device structure, in accordance with some embodiments.

Then, the dielectric layer 123 is etched to form an opening 130 using the patterned mask 125 as a mask, as shown in FIG. 13 in accordance with some embodiments. In some embodiments, the opening 130 penetrates through the dielectric layer 123, and the top surface 119bT of the manganese-containing layer 119b is partially exposed by the opening 130. The dielectric layer 123 may be etched by a wet etching process, a dry etching process, or a combination thereof. After the opening 130 is formed, the patterned mask 125 may be removed.

Figure 14:
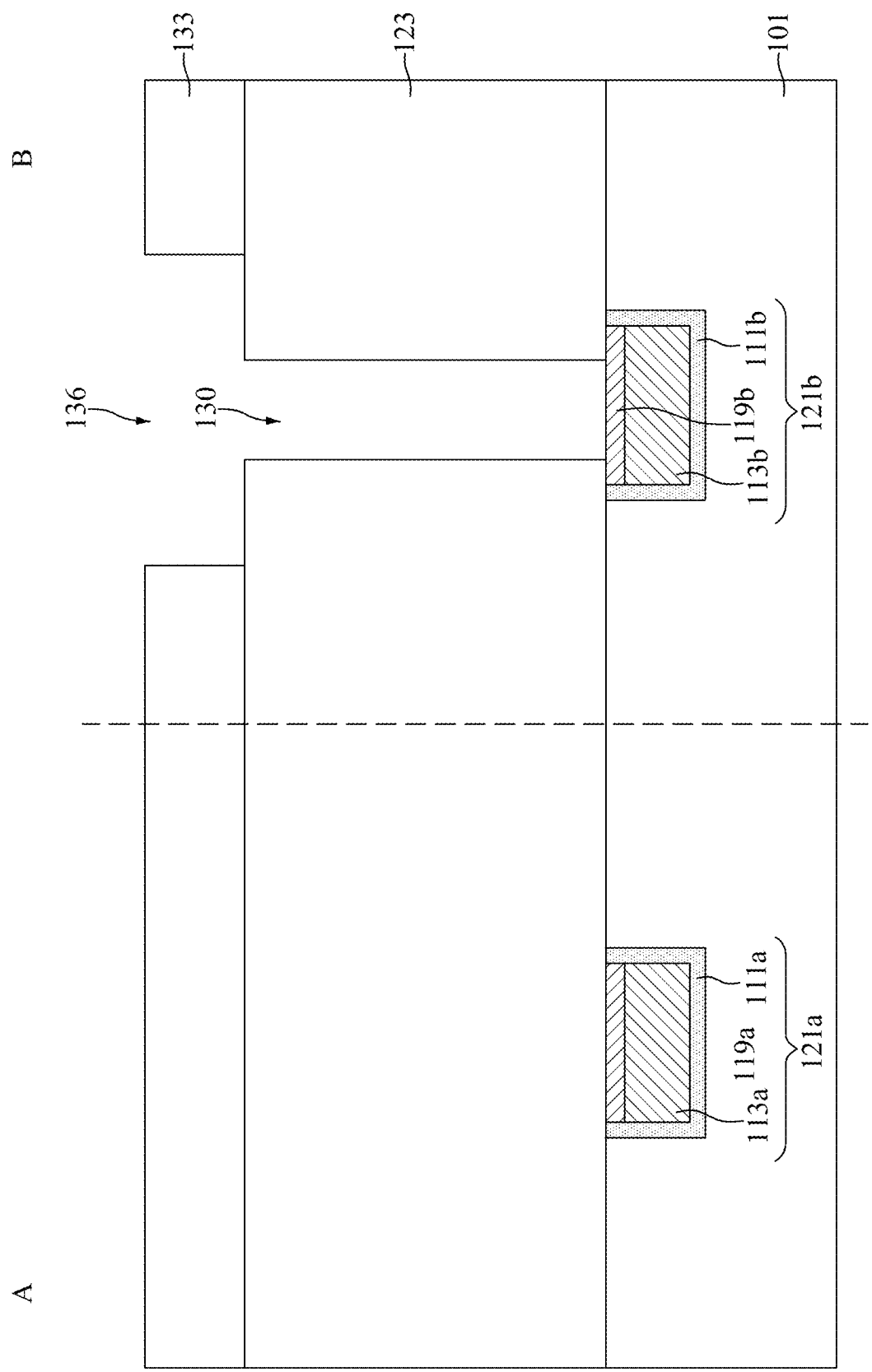
FIG. 14 is a cross-sectional view illustrating an intermediate stage of forming a patterned mask over the dielectric layer during the formation of the semiconductor device structure, in accordance with some embodiments.

After the opening 130 is formed in the dielectric layer 123, another patterned mask 133 is formed over the dielectric layer 123, as shown in FIG. 14 in accordance with some embodiments. In some embodiments, the patterned mask 133 has an opening 136 in the pattern-loose region B and over the opening 130. In some embodiments, the opening 130 in the dielectric layer 123 is entirely exposed by the opening 136 in the patterned mask 133.

Figure 15:
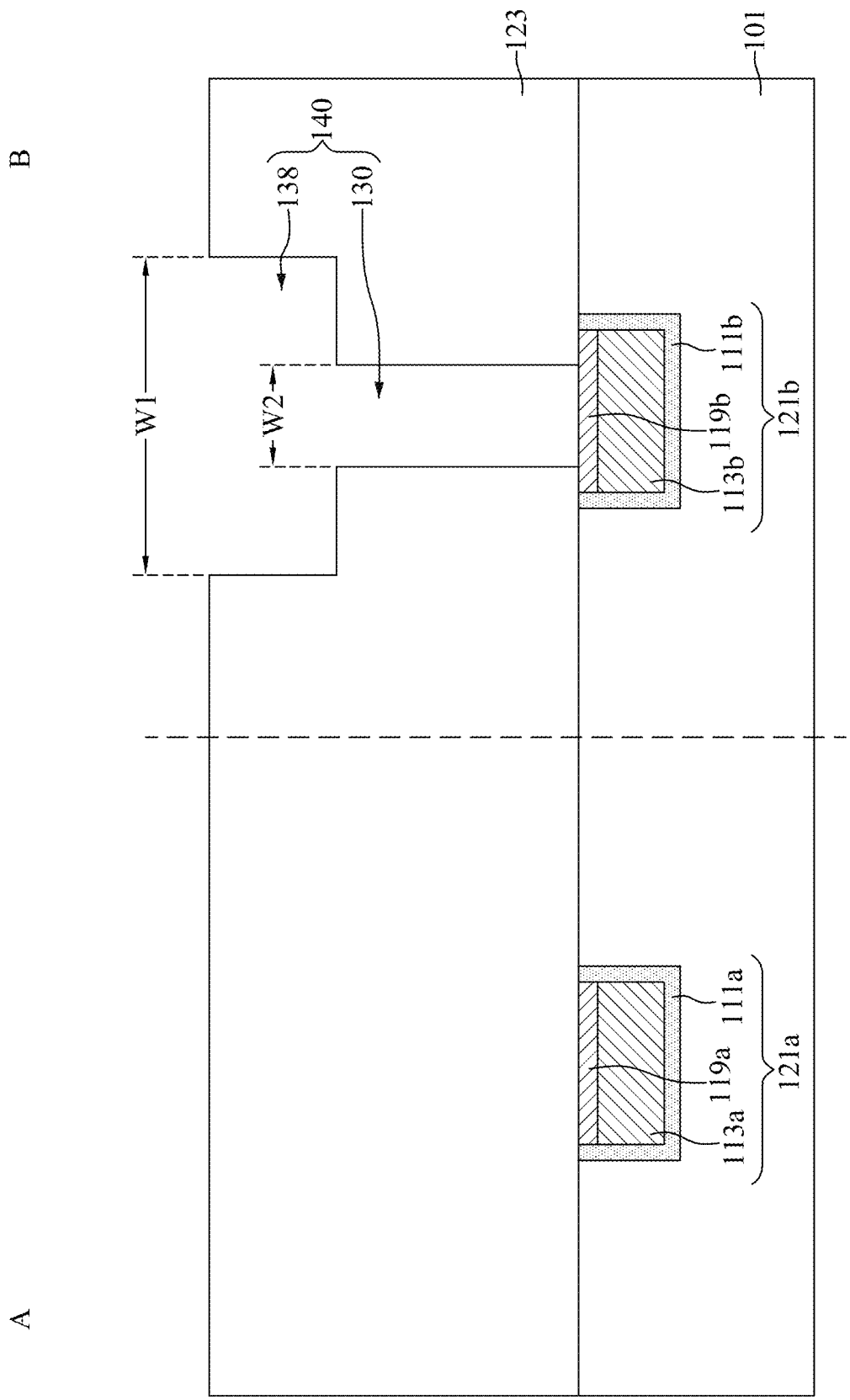
FIG. 15 is a cross-sectional view illustrating an intermediate stage of etching the dielectric layer to form an opening structure using the patterned mask as a mask during the formation of the semiconductor device structure, in accordance with some embodiments.

Next, the dielectric layer 123 is etched to form an opening 138 using the patterned mask 133 as a mask, as shown in FIG. 15 in accordance with some embodiments. The etching process may be a wet etching process, a dry etching process, or a combination thereof. In some embodiments, the dielectric layer 123 is etched to a desired level by adjusting the etching parameters.

In some embodiments, the opening 138 is connected to the opening 130, and the width W1 of the opening 138 is greater than the width W2 of the opening 130. In some embodiments, the openings 130 and 138 collectively form an opening structure 140 with stepped sidewalls. The opening 138 is also referred to herein as an upper portion of the opening structure 140, and the opening 130 is also referred to herein as a lower portion of the opening structure 140. The respective step is illustrated as the step S17 in the method 10 shown in FIG. 2. After the opening structure 140 is formed, the patterned mask 133 may be removed.

Figure 16:
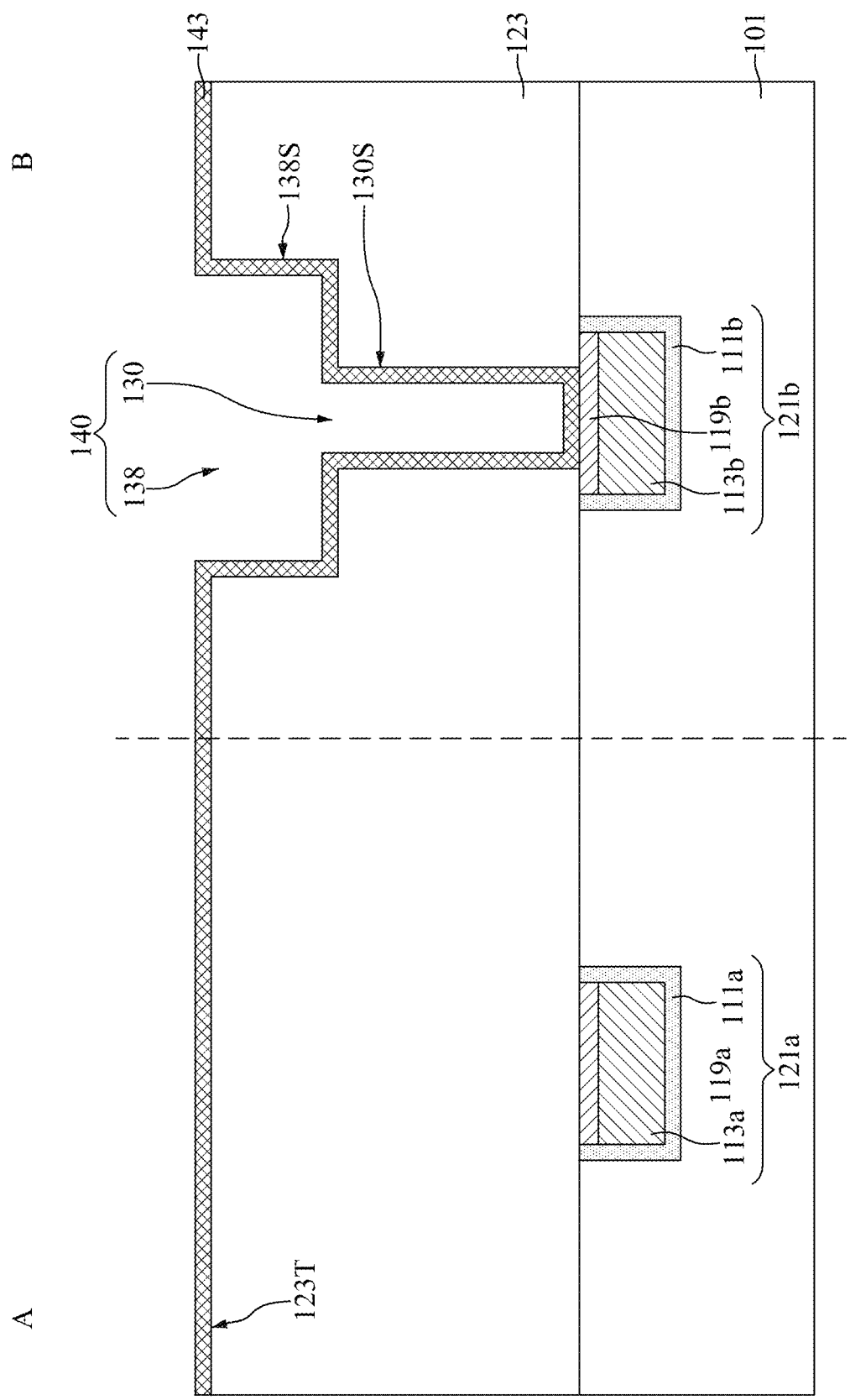
FIG. 16 is a cross-sectional view illustrating an intermediate stage of forming a barrier material in the opening structure and over the dielectric layer during the formation of the semiconductor device structure, in accordance with some embodiments.

Subsequently, a barrier material 143 is conformally deposited in the opening structure 140, and over the top surface 123T of the dielectric layer 123, as shown in FIG. 16 in accordance with some embodiments. In some embodiments, the sidewalls (i.e., the stepped sidewalls) and the bottom surface of the opening structure 140 are covered by the barrier material 143. In some embodiments, the barrier material 143 is made of tantalum (Ta), tantalum nitride (TaN), titanium (Ti), titanium nitride (TiN), a combination thereof, or another applicable material. The barrier material 143 may be formed using a conformal depositing method, such as a CVD process, a PVD process, or an ALD process.

Figure 17:
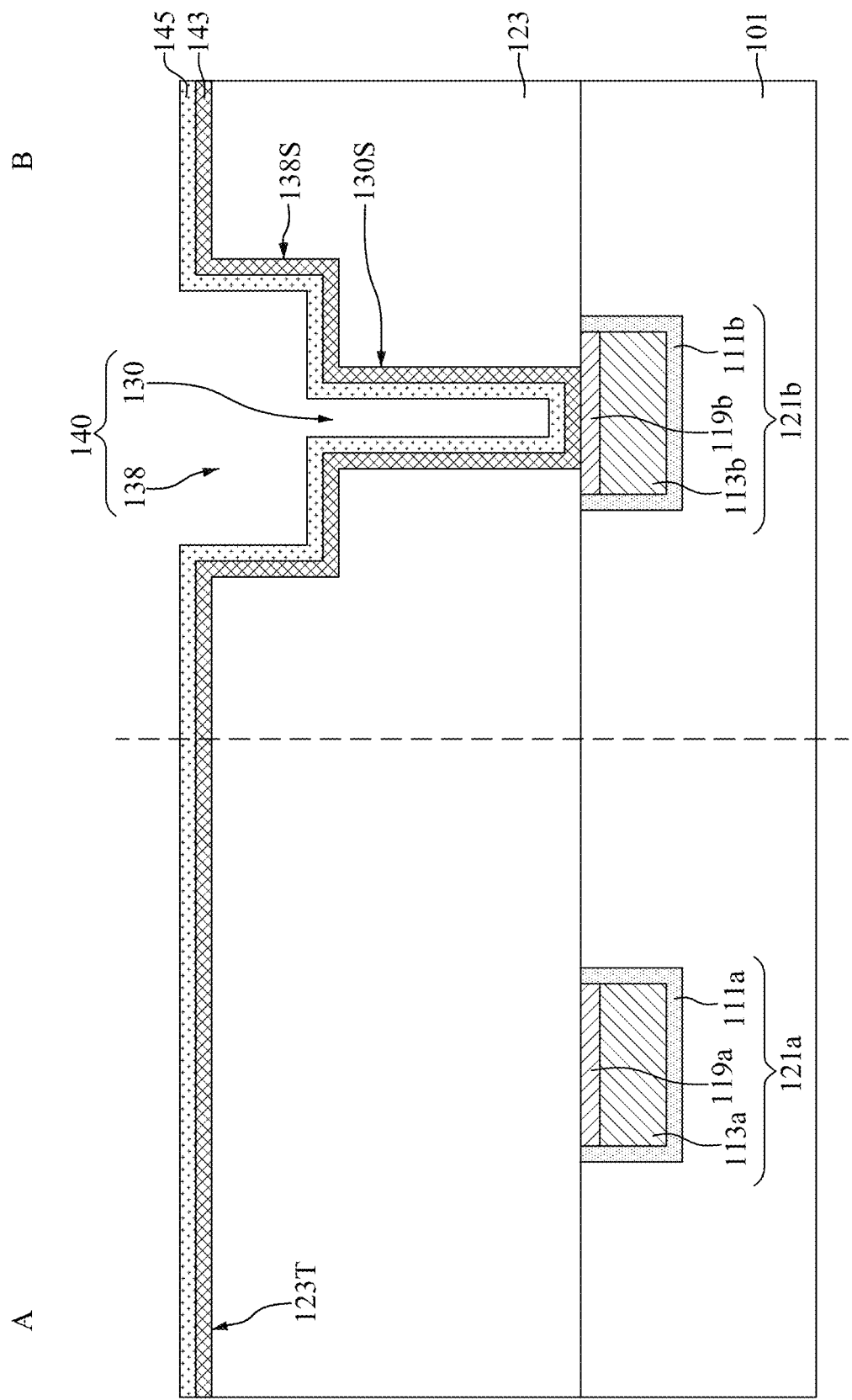
FIG. 17 is a cross-sectional view illustrating an intermediate stage of forming a manganese-containing material in the opening structure and over the barrier material during the formation of the semiconductor device structure, in accordance with some embodiments.

After the barrier material 143 is formed, a manganese-containing material 145 is formed in the remaining portion of the opening structure 140, and over the top surface 123T of the dielectric layer 123, as shown in FIG. 17 in accordance with some embodiments. In some embodiments, the barrier material 143 is entirely covered by the manganese-containing material 145. In some embodiments, the manganese-containing material 145 is made of manganese (Mn). In other embodiments, the manganese-containing material 145 is made of a manganese-rich material, such as manganese-rich copper manganese (CuMn) or manganese-rich manganese silicon (MnSi). Moreover, the manganese-containing material 145 may be formed using a conformal depositing method, such as CVD, PVD, ALD, metal organic chemical vapor deposition (MOCVD), sputtering, or plating.

Figure 18:
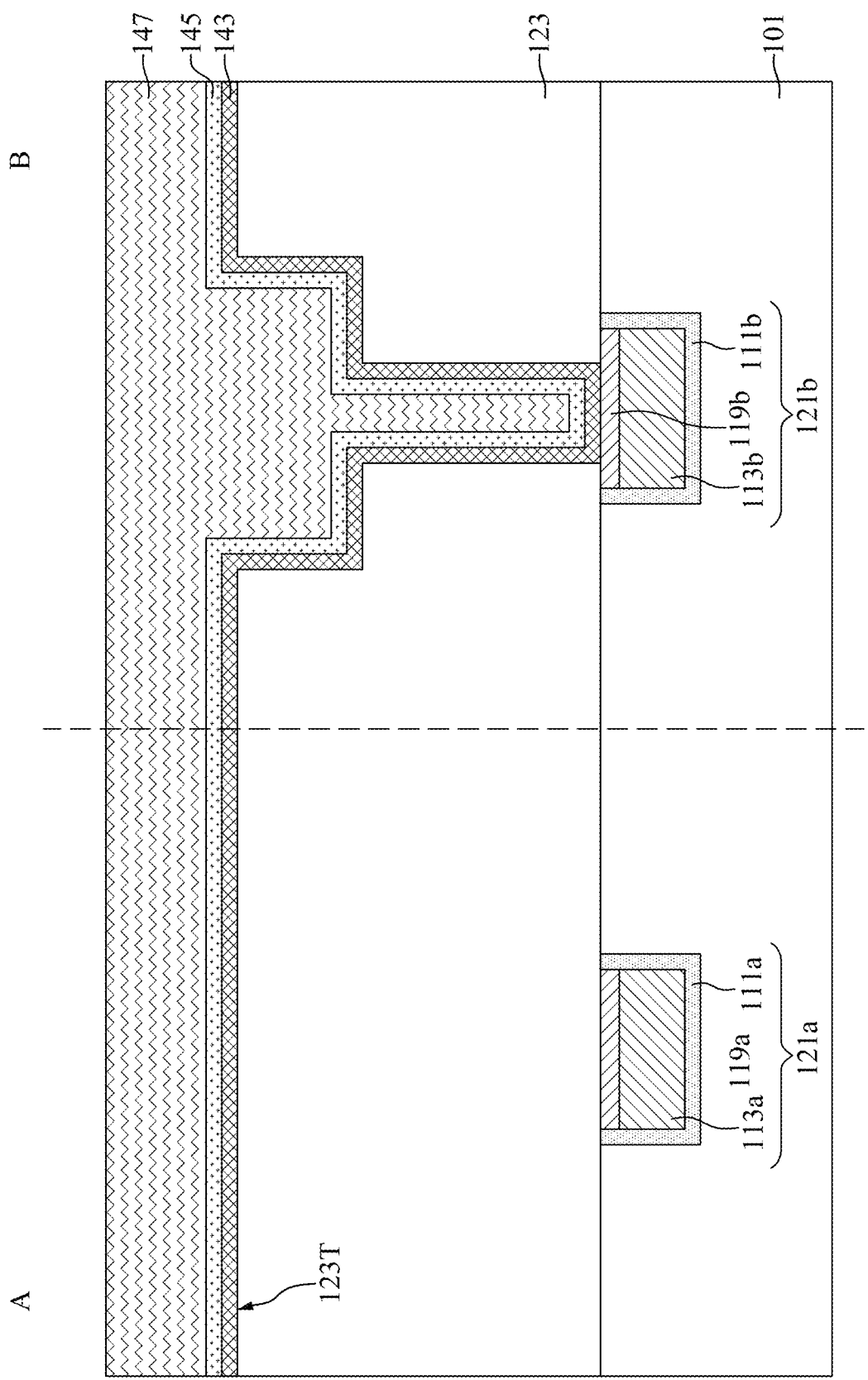
FIG. 18 is a cross-sectional view illustrating an intermediate stage of forming a conductive material in the opening structure and over the manganese-containing material during the formation of the semiconductor device structure, in accordance with some embodiments.

Then, a conductive material 147 is formed in the remaining portion of the opening structure 140 and over the top surface 123T of the dielectric layer 123, as shown in FIG. 18 in accordance with some embodiments. In some embodiments, the remaining portion of the opening structure 140 over the manganese-containing material 145 is completely filled by the conductive material 147. In some embodiments, the conductive material 147 is made of a low resistivity conductive material, such as copper (Cu). In other embodiments, the conductive material 147 includes tungsten (W), aluminum (Al), titanium (Ti), tantalum (Ta), gold (Au), silver (Ag), a combination thereof, or another applicable conductive material. The conductive material 147 may be formed by a CVD process, a PVD process, a sputtering process, a plating process, or another applicable process.

Referring back to FIG. 1, after the conductive material 147 is formed, a planarization process is performed to remove excess portions of the barrier material 143, the manganese-containing material 145 and the conductive material 147 over the top surface 123T of the dielectric layer 123, in accordance with some embodiments. The planarization process may include a CMP process.

After the planarization process, the top surface 123T of the dielectric layer 123 is exposed, the barrier layer 143', the manganese-containing layer 145' and the conductive line 147' are formed in the dielectric layer 123, and the interconnect structure 149 in the pattern-loose region B is obtained. The respective step is illustrated as the step S19 in the method 10 shown in FIG. 2. In some embodiments, the opening 138 (see FIG. 15) is occupied by an upper portion of the interconnect structure 149, and the opening 130 (see FIG. 15) is occupied by a lower portion of the interconnect structure 149.

Referring to FIGS. 1 and 15, the conductive line 147 has an upper portion filled in the opening 138 and a lower portion filled in the opening 130, and the width of the upper portion of the conductive line 147 is greater than the width of the lower portion of the conductive line 147, in accordance with some embodiments. In some embodiments, the top surfaces of the barrier layer 143', the manganese-containing layer 145' and the conductive line 147' are substantially level with the top surface 123T of the dielectric layer 123. After the interconnect structure 149 is formed, the semiconductor device structure 100 is obtained. In some embodiments, the semiconductor device structure 100 is part of a dynamic random access memory (DRAM).

Figure 19:
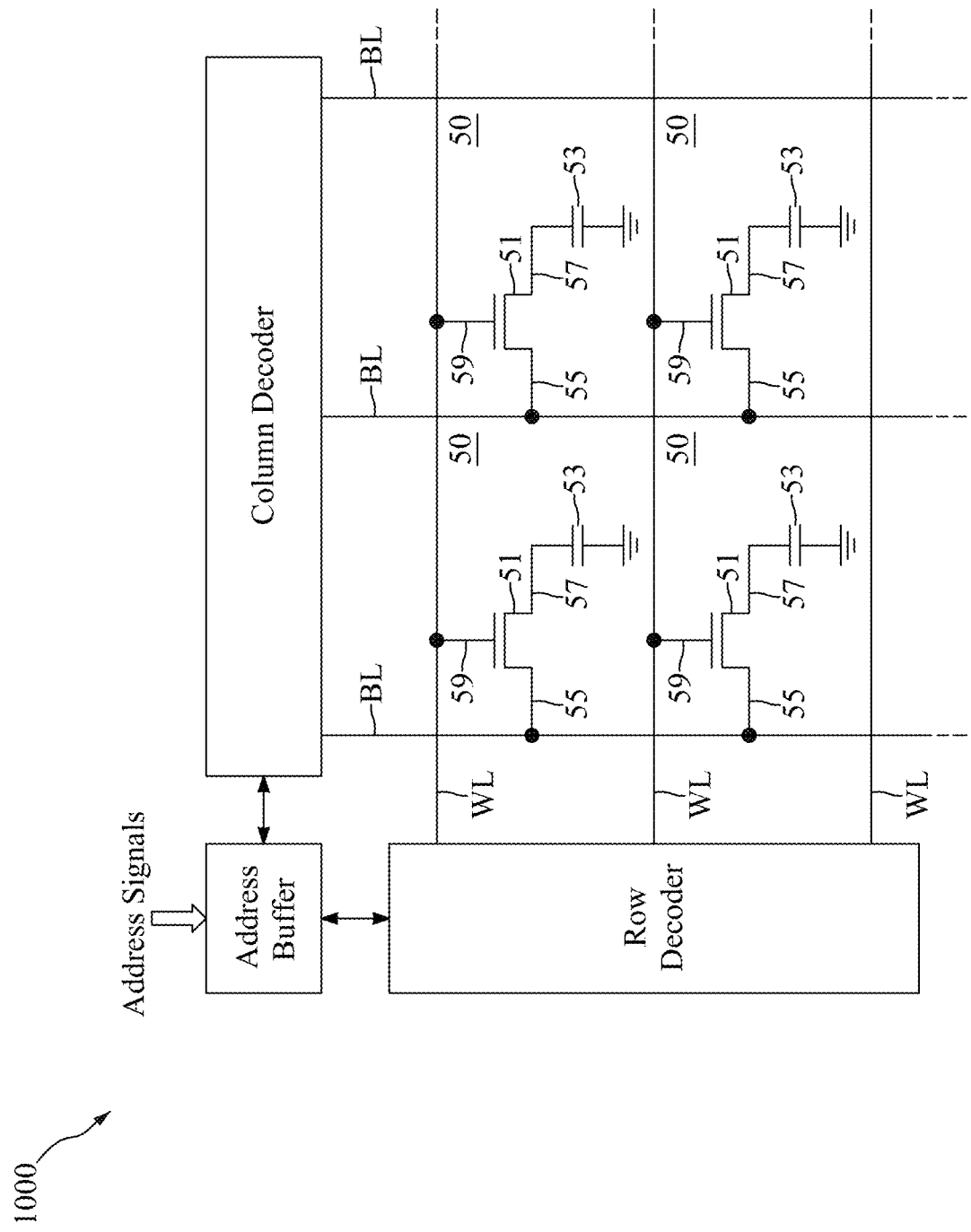
FIG. 19 is a partial schematic illustration of an exemplary integrated circuit, including an array of memory cells in accordance with some embodiments.

FIG. 19 is a partial schematic illustration of an exemplary integrated circuit, such as a memory device 1000, including an array of memory cells 50 in accordance with some embodiments. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIG. 1, the interconnect structure 121a is formed in the pattern-dense region A, while the interconnect structures 121b and 149 are formed in the pattern-loose region B. The pattern-dense region A may be any of the regions of the memory cells 50 in the memory device 1000, and the pattern-loose region B may be any of the regions of the address buffer, the row decoder, or the column decoder in the memory device 1000.

Embodiments of the semiconductor device structure 100 and method for forming the same are provided in the disclosure. In some embodiments, the semiconductor device structure 100 includes a first interconnect structure (e.g., the interconnect structure 121b) disposed in a semiconductor substrate, and a second interconnect structure (e.g., the interconnect structure 149) disposed in a dielectric layer over the semiconductor substrate. The first interconnect structure is electrically connected to the second interconnect structure, and both the first and second interconnect structures are disposed in a pattern-loose region. The first interconnect structure includes a first manganese-containing layer (e.g., the manganese-containing layer 119b) disposed over a first conductive line (e.g., the conductive line 113b), and the second interconnect structure includes a second manganese-containing layer (e.g., the manganese-containing layer 145') disposed between a second conductive line (e.g., the conductive line 147') and the dielectric layer. The first and second manganese-containing layers are configured to reduce or prevent voids from forming in the first and second conductive lines, thereby decreasing the contact resistance. As a result, the operation speed of the semiconductor device structure 100 may be increased, which significantly improves the overall device performance.

In one embodiment of the present disclosure, a semiconductor device structure is provided. The semiconductor device structure includes a first interconnect structure disposed in a semiconductor substrate, a dielectric layer disposed over the semiconductor substrate, and a second interconnect structure disposed in the dielectric layer and electrically connected to the first interconnect structure. The first interconnect structure includes a first conductive line, and a first manganese-containing layer disposed over the first conductive line. The second interconnect structure includes a second conductive line, and a second manganese-containing layer disposed between the second conductive line and the dielectric layer.

In another embodiment of the present disclosure, a semiconductor device structure is provided. The semiconductor device structure includes a first interconnect structure disposed in a semiconductor substrate, and a second interconnect structure disposed over the semiconductor substrate and electrically connected to the first interconnect structure. The first interconnect structure includes a first barrier layer, a first conductive line disposed over the first barrier layer, and a first manganese-containing layer disposed over the first conductive line. The first manganese-containing layer and the first conductive line are separated from the semiconductor substrate by the first barrier layer. The second interconnect structure includes a second barrier layer disposed over and in direct contact with the first manganese-containing layer, a second manganese-containing layer disposed over the second barrier layer, and a second conductive line disposed over the second manganese-containing layer.

In yet another embodiment of the present disclosure, a semiconductor device structure is provided. The semiconductor device structure includes a first interconnect structure disposed in a semiconductor substrate, and a second interconnect structure disposed over and electrically connected to the first interconnect structure. The first interconnect structure includes a first conductive line, and a first manganese-containing layer disposed over the first conductive line. A top surface of the first manganese-containing layer is substantially level with a top surface of the semiconductor substrate. The second interconnect structure includes a second manganese-containing layer, and a second conductive line disposed over the second manganese-containing layer. The second manganese-containing layer covers sidewalls of the second conductive line. The first interconnect structure has a first manganese atomic percentage, the second interconnect structure has a second manganese atomic percentage, and the first manganese atomic percentage is different from the second manganese atomic percentage.

The embodiments of the present disclosure have some advantageous features. By forming the manganese-containing layers in the interconnect structures, the resistance of the conductive lines in the interconnect structures may be decreased. As a result, the operation speed of the semiconductor device structure is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
   a first interconnect structure disposed in a semiconductor substrate, wherein the first interconnect structure comprises:
      a first conductive line; and
      a first manganese-containing layer disposed over the first conductive line;
   a dielectric layer disposed over the semiconductor substrate;
   a second interconnect structure disposed in the dielectric layer and electrically connected to the first interconnect structure, wherein the second interconnect structure comprises:
      a second conductive line; and
      a second manganese-containing layer disposed between the second conductive line and the dielectric layer; and
   a third interconnect structure disposed in the semiconductor substrate, wherein the third interconnect structure comprises:
      a third conductive line; and
      a third manganese-containing layer disposed over the third conductive line, wherein the third manganese-containing layer of the third interconnect structure and the first manganese-containing layer of the first interconnect structure are made of a same material;
   wherein the first interconnect structure and the second interconnect structure are disposed in a pattern-loose region, and wherein the third interconnect structure is disposed in a pattern-dense region.

2. The semiconductor device structure of claim 1, wherein the first manganese-containing layer and the second manganese-containing layer are made of manganese, and wherein the first conductive line and the second conductive line are made of copper.

3. The semiconductor device structure of claim 1, wherein a top surface of the first manganese-containing layer is substantially level with a top surface of the semiconductor substrate.

4. The semiconductor device structure of claim 1, wherein the first interconnect structure further comprises:
   a first barrier layer surrounding the first conductive line and the first manganese-containing layer, wherein the first conductive line is disposed over the first barrier layer.

5. The semiconductor device structure of claim 1, wherein the second interconnect structure further comprises:
   a second barrier layer disposed between the second manganese-containing layer and the dielectric layer, wherein the second barrier layer is in direct contact with the first manganese-containing layer of the first interconnect structure.

6. A semiconductor device structure, comprising:
   a first interconnect structure disposed in a semiconductor substrate, wherein the first interconnect structure comprises:
      a first barrier layer;
      a first conductive line disposed over the first barrier layer; and
      a first manganese-containing layer disposed over the first conductive line, wherein the first manganese-containing layer and the first conductive line are separated from the semiconductor substrate by the first barrier layer;

a second interconnect structure disposed over the semiconductor substrate and electrically connected to the first interconnect structure, wherein the second interconnect structure comprises:
- a second barrier layer disposed over and in direct contact with the first manganese-containing layer;
- a second manganese-containing layer disposed over the second barrier layer; and
- a second conductive line disposed over the second manganese-containing layer; and a third interconnect structure disposed in the semiconductor substrate, wherein the third interconnect structure comprises:
- a third conductive line; and
- a third manganese-containing layer disposed over the third conductive line, wherein the third manganese-containing layer of the third interconnect structure and the first manganese-containing layer of the first interconnect structure are made of a same material;

wherein the third interconnect structure is entirely covered by the dielectric layer.

7. The semiconductor device structure of claim 6, wherein the second conductive line is surrounded by the second manganese-containing layer, and the second manganese-containing layer is surrounded by the second barrier layer.

8. The semiconductor device structure of claim 6, wherein a width of an upper portion of the second conductive line is greater than a width of a lower portion of the second conductive line.

9. The semiconductor device structure of claim 6, further comprising:
a dielectric layer disposed over the semiconductor substrate and covering a portion of the first barrier layer and a portion of the first manganese-containing layer, wherein the second interconnect structure penetrates through the dielectric layer.

10. The semiconductor device structure of claim 6, wherein the first conductive line and the second conductive line comprise copper.

11. The semiconductor device structure of claim 6, wherein the first interconnect structure has a first manganese atomic percentage, the second interconnect structure has a second manganese atomic percentage, and the first manganese atomic percentage is different from the second manganese atomic percentage.

12. The semiconductor device structure of claim 11, wherein the first manganese atomic percentage is greater than the second manganese atomic percentage.

13. A semiconductor device structure, comprising:
a first interconnect structure disposed in a semiconductor substrate, wherein the first interconnect structure comprises:
- a first conductive line; and
- a first manganese-containing layer disposed over the first conductive line, wherein a top surface of the first manganese-containing layer is substantially level with a top surface of the semiconductor substrate;

a second interconnect structure disposed over and electrically connected to the first interconnect structure, wherein the second interconnect structure comprises:
- a second manganese-containing layer; and
- a second conductive line disposed over the second manganese-containing layer, wherein the second manganese-containing layer covers sidewalls of the second conductive line, wherein the first interconnect structure has a first manganese atomic percentage, the second interconnect structure has a second manganese atomic percentage, and the first manganese atomic percentage is different from the second manganese atomic percentage; and a third interconnect structure disposed in the semiconductor substrate, wherein the third interconnect structure comprise:
- a third conductive line; and
- a third manganese-containing layer disposed over the third conductive line, wherein the third interconnect structure is disposed in a pattern-dense region, and the first interconnect structure and the second interconnect structure are disposed in a pattern-loose region.

14. The semiconductor device structure of claim 13, wherein the first manganese atomic percentage is greater than the second manganese atomic percentage.

15. The semiconductor device structure of claim 13, wherein the third interconnect structure has a third manganese atomic percentage, and the third manganese atomic percentage is greater than the second manganese atomic percentage.

16. The semiconductor device structure of claim 13, wherein the first interconnect structure further comprises a first barrier layer separating the first conductive line and the first manganese-containing layer from the semiconductor substrate, and the second interconnect structure further comprises a second barrier layer sandwiched between the second manganese-containing layer and the first manganese-containing layer.

* * * * *